(12) United States Patent
Gazi et al.

(10) Patent No.: US 11,012,093 B2
(45) Date of Patent: May 18, 2021

(54) HIGH-SPEED DECODER FOR POLAR CODES

(71) Applicant: CANKAYA UNIVERSITESI, Ankara (TR)

(72) Inventors: Orhan Gazi, Ankara (TR); Alia Andi, Ankara (TR); Ahmet Cagri Arli, Ankara (TR)

(73) Assignee: CANKAYA UNIVERSITESI, Ankara (TR)

( * ) Notice: Subject to any disclaimer, the term of this patent is extended or adjusted under 35 U.S.C. 154(b) by 0 days.

(21) Appl. No.: 16/766,364

(22) PCT Filed: Dec. 5, 2017

(86) PCT No.: PCT/TR2017/050627
§ 371 (c)(1),
(2) Date: May 22, 2020

(87) PCT Pub. No.: WO2019/112524
PCT Pub. Date: Jun. 13, 2019

(65) Prior Publication Data
US 2020/0382136 A1    Dec. 3, 2020

(51) Int. Cl.
H03M 13/13    (2006.01)
H03M 13/00    (2006.01)

(52) U.S. Cl.
CPC ......... *H03M 13/13* (2013.01); *H03M 13/136* (2013.01); *H03M 13/6502* (2013.01); *H03M 13/6561* (2013.01)

(58) Field of Classification Search
CPC ............ H03M 13/13; H03M 13/6561; H03M 13/6502
See application file for complete search history.

(56) References Cited

U.S. PATENT DOCUMENTS

2013/0117344 A1* 5/2013 Gross ............... H03M 13/1575
708/490
2015/0333775 A1  11/2015 Broadcom Corp
2015/0381208 A1  12/2015 Li et al.
(Continued)

FOREIGN PATENT DOCUMENTS

KR       101496182 B1   3/2015
KR     20150125744 A   11/2015
(Continued)

OTHER PUBLICATIONS

Camille Leroux, Alexandre J. Raymond, Gabi Sarkis, and Warren J. Gross; A Semi-Parallel Successive-Cancellation Decoder for Polar Codes; IEEE Transactions On Signal Processing, vol. 61, No. 2, Jan. 15, 2013, pp. 289-299 (Year: 2013).*
(Continued)

*Primary Examiner* — Joseph D Torres
(74) *Attorney, Agent, or Firm* — Bayramoglu Law Offices LLC

(57) ABSTRACT

A high speed decoding algorithm that can decode all the information bits simultaneously at the same time, i.e., in parallel. The method of high speed decoding of polar codes includes the steps of transmitting data bits through a second part of communication channels, wherein a receiver is provided to set frozen bits as 0, apply Sc algorithm, and decode remaining bits in parallel.

9 Claims, 9 Drawing Sheets

(56) References Cited

U.S. PATENT DOCUMENTS

| | | | |
|---|---|---|---|
| 2016/0013810 A1* | 1/2016 | Gross | H03M 13/13 714/776 |
| 2016/0056843 A1 | 2/2016 | Gross et al. | |
| 2017/0214416 A1* | 7/2017 | Ge | H03M 13/13 |
| 2018/0183464 A1* | 6/2018 | Ge | H04L 1/0041 |

FOREIGN PATENT DOCUMENTS

| | | |
|---|---|---|
| KR | 101600759 B1 | 3/2016 |
| WO | 2016119105 A1 | 8/2016 |
| WO | 2016172934 A1 | 11/2016 |
| WO | 2017092693 A1 | 6/2017 |

OTHER PUBLICATIONS

Erdal Arikan, Channel Polarization: A Method for Constructing Capacity-Achieving Codes for Symmetric Binary-Input Memoryless Channels, IEEE Transactions on Information Theory, Jul. 2009, pp. 3051-3073, vol. 55, No. 7.

Erdal Arikan, Channel Combining and Splitting for Cutoff Rate Improvement, IEEE Transactions on Information Theory, Feb. 2006, pp. 628-639, vol. 52, No. 2.

Eren Sasoglu, et al., Polarization for arbitrary discrete memoryless channels, IEEE Information Theory Workshop, 2009, pp. 144-148.

Erdal Arikan, A Performance Comparison of Polar Codes and Reed-Muller Codes, IEEE Communications Letters, Jun. 2008, pp. 447-449, vol. 12, No. 6.

Kai Chen, et al., Improved Successive Cancellation Decoding of Polar Codes, IEEE Transactions on Communications, Aug. 2013, pp. 3100-3107, vol. 61, No. 8.

Bo Yuan, Algorithm and VLSI Architecture for Polar Codes Decoder, Ph.D. Dissertation, Jul. 2015.

Alexios Balatsoukas, et al., LLR-Based Successive Cancellation List Decoding of Polar Codes, IEEE Transactions on Signal Processing, Mar. 6, 2015.

Xiao Liang, et al., Efficient Stochastic List Successive Cancellation Decoder for Polar Codes, IEEE, 2015, pp. 421-426.

Orion Afisiadis, et al., A Low-Complexity Improved Successive Cancellation Decoder for Polar Codes, IEEE, Asilomar, 2014, pp. 2116-2120.

Chuan Zhang, et al., Efficient Adaptive List Successive Cancellation Decoder for Polar Codes, IEEE, Asilomar, 2014, pp. 126-130.

Ammar Hadi, et al., A Method to Enhance the Performance of Successive Cancellation Decoding in Polar Codes, 2016 10th International Symposium on Communication Systems, Networks and Digital Signal Processing (CSNDSP), IEEE, 2016, pp. 1-5.

Dan Le, et al., Decoding schedule generating method for successive-cancellation decoder of polar codes, IET Communications, The Institution of Engineering and Technology, 2016, pp. 462-467, vol. 10, Iss. 5.

Camille Leroux, et al., A Semi-Parallel Successive-Cancellation Decoder for Polar Codes, IEEE Transactions on Signal Processing, Jan. 15, 2013, pp. 289-299, vol. 61, No. 2.

Ramtin Pedarsani, et al., On the Construction of Polar Codes, IEEE International Symposium on Information Theory Proceedings, 2011, pp. 11-15.

Navneet Kaur, et al., Implementation of Polar Codes over AWGN and Binary Symmetric Channel, Indian Journal o Science and Technology, May 2016, vol. 9(19).

Gabi Sarkis, et al., Increasing the Throughput of Polar Decoders, IEEE Communications Letters, Apr. 2013, pp. 725-,728, vol. 17, No. 4.

Seyyed Ali Hashemi, et al., A Fast Polar Code List Decoder Architecture Based on Sphere Decoding, IEEE Transactions on Circuits and Systems-I: Regular Papers, 2016, pp. 1-13.

Gabi Sarkis, et al., Fast Polar Decoders: Algorithm and Implementation, IEEE Journal on Selected Areas in Communications, May 2014, pp. 946-957, vol. 32, No. 5.

Gabi Sarkis, et al., Increasing the Speed of Polar List Decoders, IEEE Workshop on Signal Processing Systems (SIPS), 2014, pp. 1-6.

* cited by examiner

| Frozen part | Use classical SC decoding for the 50% of the information bits | Use the proposed high speed decoding for rest of the 50% of the information bits |
|---|---|---|
| 512 Frozen bits | Decode 256 bits using classical SC decoder | Decode 256 bits using proposed high speed decoding technique |

FIG. 3

HIGH-SPEED DECODER FOR POLAR CODES

CROSS REFERENCES TO THE RELATED APPLICATIONS

This application is the national phase of International Application No. PCT/TR2017/050627, filed on Dec. 5, 2017, the entire contents of which are incorporated herein by reference.

TECHNICAL FIELD

The invention relates to high speed decoding algorithm that can decode all the information bits simultaneously at the same time, i.e., in parallel.

BACKGROUND

Capacity-achieving polar codes are constructed using the idea of channel polarization. Channel polarization refers to the fact that it is possible to synthesize, out of N independent copies of a given B-DMC, i.e., W, a new set of N binary-input channels $\{I(W_N^{(i)}: 1 \leq i \leq N\}$ such that, as N becomes very large, the fraction of indices i for which $I(W_N^{(i)})$ is close to 1 approaches to $I(W)$ and the fraction for which $I(W_N^{(i)})$ is close to 0 approaches to $1-I(W)$[1]. The polarized channels $\{W_N^{(i)}\}$ are well conditioned for channel coding; one need only send data at rate 1 through those with capacity near 1 and at rate 0 though the remaining channels [1]. Information bits are transmitted over these good channels, which can also be considered as noiseless channels, and fixed bits, i.e., frozen bit, are transmitted over the bad channels. Polar codes can achieve the symmetric capacity under a successive cancellation decoding. The complexity of polar encoding and decoding complexities is on the order of $O(N \log N)$ [17]. When the code length N is large enough, the block error probability of the polar code under SC decoding satisfy $$Pe(N,R) \leq 0(N-0.5)$$

where $R < I(W)$.

3. Channel Polarization

Binary input discrete memoryless channel is characterized by $W(y|x)$ where $x \in X$ and $y \in Y$, $X,Y$ are finite-input and finite-output symbol sets, $W(y|x)$ are transition probabilities, $W_N$ denotes the discrete memoryless channel corresponding to N uses of $W_N:X^X - Y^N$ with $$W_N(y_1^N | x_1^N) = \prod_{i=1}^{N} W(y_i | x_i)$$

where N can be any power of two $N=2^n$, $n \geq 0$ [1], [16]. For a binary input channel $W:X-Y$ with $X=\{0,1\}$ the symmetric capacity can be calculated as:

$$I(W) \triangleq \sum_{x,y} \frac{1}{2} W(y|x) \log_2 \frac{w(y|x)}{\frac{1}{2}(w(y|0)+w(y|1))}. \tag{3}$$

And for this channel the Bhattacharya parameter is computed by:

$$Z(W) \triangleq \sum_{y \in Y} \sqrt{W(y|0)(y|1)} \tag{4}$$

$I(W)$ is the highest rate for which reliable communication is possible across W. $Z(W)$ is an upper bound on the maximum-likelihood (ML) decision error probability when W is used only once to transmit a 0 or 1 [1].

Subsequently, as $N \to \infty$, channels are polarized, i.e., they can be considered as completely noisy or noiseless and these channels are known exactly at the transmitter side; so, bad channels can be fixed and transmit information bits over the good ones [2].

C. Channel Combining

N independent copies of B-DMC are combined in a recursive manner to produce a vector channel given by: $W_N:X^X - Y^N$ where $N=2^n$, $n \geq 0$.

For N=4, two independent copies of $W_2$ are combined to construct $W_4:X^4 - Y^4$, as shown in FIG. 4.

The mapping $u_1^4 - x_1^4$ from the input of $W_4$ to the output of $W_4$ can be described $x_1^4 = u_1^4 G_4$ where $$G_4 = \begin{bmatrix} 1 & 0 & 0 & 0 \\ 1 & 0 & 1 & 0 \\ 1 & 1 & 0 & 0 \\ 1 & 1 & 1 & 1 \end{bmatrix}$$

is the generator matrix and $W_4(y_1^4|x_1^4) = W_4(y_1^4|u_1^4 G_4)$[1].

In general, the channel can be constructed $W_N:X^X - Y^N$ by combining two independent copies of $W_{N/2}$. The generator matrix is calculated as $G_N = B_N F^{\otimes n}$ where $$F \triangleq \begin{bmatrix} 1 & 0 \\ 1 & 1 \end{bmatrix},$$

$B_N$ is the permutation matrix also known as bit-reversal matrix which is calculated as $B_N = R_N(I_2 \otimes B_{N/2})$ where $I_2$ is the identity matrix, and $B_2$ is initialized as $B_2 = I_2$. $R_N$ in which $R_N$ is the permutation operation, for instance, $R_4$ maps the input $\{1,2,3,4\}$ to $\{1,3,2,4\}$ [2], [16].

D. Channel Splitting

When the vector channel $W_N$ is synthesized from independent copies of W, $W_N$ is split back into a set of channels $W_N^{(i)}:X \to Y^N \times X^{i-1}$, $0 \leq i \leq N$, the transition probabilities of these channels are calculated as [1], [5], [14]:

$$W_N^{(i)}(y_1^N, u_1^{i-1} | u_i) \triangleq \sum_{u_{i+1}^N \in X^{N-i}} \frac{1}{2^{N-i}} W(y_1^N | u_1^N). \tag{5}$$

4. Polar Coding

The idea of polar coding is to build a coding system by utilizing channels $W_N^{(i)}$ individually and send data through those for which $X(W_N^{(i)})$ is close to '0', i.e., $I(W_N^{(i)})$ is close to '2' [4].

D. Non-Systematic Encoding

A binary source block $u_1^N$ is a row vector $(u_1, u_2, \ldots, u_N)$ consisting of K information bits and N-K frozen bits is mapped to a code block $x_1^N$ by $x_1^N = u_1^N G_N$ where, $$G_N = u_A G_N(A) \oplus u_{A^c} G_N(A^c). \tag{6}$$

in which A is any arbitrary subset of $\{1, 2 \ldots, N\}$ and $G_N(A)$ is a submatrix formed with indices in A. Polar codes can be determined by three parameters (N, K, A, $u_{A^c}$), where $u_{A^c} \in X^{N-K}$ (frozen bits) and K is dimension of code and A [5], [15].

E. A Successive Cancellation (SC) Decoder

The encoder maps the input bits $u_1^N$ into the codeword $x_1^N$, which is transmitted through the channels $W_N$ and $y_1^N$ is received signal. The task of the decoder is to estimate information bits $u_1^N$ from the received signal $y_1^N$. Actually, the duty of the decoder is to estimate the data bits using $$\hat{u}_i \triangleq \begin{cases} u_i, & \text{if } \in A^c \\ h_i(y_1^N, \hat{u}_1^{i-1}), & \text{if } i \in A \end{cases} \quad (7)$$

where $h_i(y_1^N, \hat{u}_1^{i-1})$ is decision function defined as:

$$(y_1^N, \hat{u}_1^{i-1}) \triangleq \begin{cases} 0, \text{IF } \frac{W_N^{(l)}(Y_1^N, \hat{U}_1^{l-1}|0)}{W_N^{(l)}(Y_1^N, \hat{U}_1^{l-1}|1)} \geq 1 \\ 1, \text{OTHERWISE} \end{cases} \quad (8)$$

In (8) the rational term can be defined as $$L_N^{(i)}(Y_1^N, \hat{U}_1^{l-1}) \triangleq \frac{W_N^{(l)}(Y_1^N, \hat{U}_1^{l-1}|0)}{W_N^{(l)}(Y_1^N, \hat{U}_1^{l-1}|1)}, \quad (9)$$

where $L_N^{(i)}$ is named as likelihood ratio (LR) [1], [16], [12].

F. Tree Structure

In this subsection, tree structure is proposed for the decoding of polar codes employing successive cancellation algorithm. The LRs can be calculated efficiently in a tree graph which contains two types of nodes, namely labeled nodes 'g', and unlabeled nodes 'f'. Both types of nodes have two input LRs and one output LR.

For easy of illustration let's consider the successive cancellation decoding employing only four information bits as depicted in FIG. 5. In order to estimate the transmitted bit $u_i$, the likelihood pair have to be calculated at depth N using the received signal which are fed to the decoder as shown in FIG. 5a. An N LRs located at N nodes are combined to produce N/2 LRs. This procedure is carried out until a single node with a single LR exists, and then decision is made about the transmitted information bit.

From FIG. 5 it can be seen that, $a = c \oplus d$ and $b = d$, and it can be shown that $LR_a$ at (f) node and $LR_b$ at (g) node, can be calculated as in (10) and (11) [6]

$$LR_a = \frac{W(a=0)}{W(a=1)} \rightarrow \quad (10)$$

$$LR_a = \frac{W(c=0)W(d=0) + W(c=1)W(d=1)}{W(c=0)W(d=1) + W(c=1)W(d=0)}$$

$$\rightarrow$$

$$LR_a = \frac{1 + LR_c \times LR_d}{LR_c \times LR_d}.$$

The LR at g-node can be calculated as $$LR(b)_{a=0} = \frac{W(a=0, b=0)}{W(a=0, b=1)} = LR_c \times LR_d.$$

Similarly, $$LR_b(a=1) = LR_c^{-1} \times LR_d.$$

In general, $$LR_b(a=u) = LR_c^{1-2a} \times LR_d. \quad (11)$$

As an example, FIG. 6a shows the calculation of the node likelihoods for the decoding of the first bit, i.e., $u_1$. And this operation can be illustrated with a tree structure as in FIG. 6b. After calculation of the node likelihood for the top-node of the tree, the decision is made using $$u_1 = \begin{cases} 0, & \text{if } LR_{u_1} \geq 1 \\ 1, & \text{otherwise} \end{cases}.$$

Improving the polar decoder performance in terms of both decreasing complexity and decoding speed are the main issues in journals and patents. Thus, literature review is going to be done in two separate parts. In the first part, journals are going to be covered and then in the following part related patent studies are going to be mentioned.

Polar codes are introduced in [1] as the first mathematically provably capacity achieving channel codes for symmetric binary-input discrete memoryless channels (B-DMC) with low encoding and decoding complexity. Later, the polarization concept extended to non-binary alphabets, such as source coding scenarios, and distributed settings. Before the introduction of polar codes, the constructive ideas for polar coding and channel polarization appeared in Arikan's earlier papers [2] and [3].

Shortly after the introduction of polar codes, a number of papers have been published on its performance areas of its applicability. In [4], authors studied on the advantage of polar codes over Reed-Muller codes under belief-propagation decoding. In [5], [6], [7], [8]-[11], the improved versions of the successive cancellation (SC) decoding algorithm, the successive cancellation list (SCL) and the successive cancellation stack (SCS) decoding methods which give show better performance for polar codes without increasing the code lengths are introduced. In [12], the main ideas and techniques of channel polarization, polar codes and the SC decoding algorithm are presented. In [13], a semi-parallel architecture for the implementation of successive cancellation decoding is presented. In [14], authors take the advantage of the recursive structure of polar codes to construct a unified scheme with a single encoder and decoder that can be used over the multi-channels. The problem of efficient construction of polar codes for BMS channels is considered in [15]. In [16], BER estimation of polar codes over different channel models like AWGN and BSC is studied at different block lengths. Speeding-up techniques have been proposed in [17]-[20], and in [17] an algorithm is proposed which increases the throughput of the simplified successive-cancellation decoding algorithm three times. In [18], a fast list decoder was proposed and implemented in software to decode different nodes in the graph of polar codes in fewer clock cycles. The work in [19] aims to increase the throughput of polar decoding by an order of magnitude relative to successive-cancellation decoders.

There are also patent studies about polar decoder designs. There are 10 patent applications which seem related to polar decoder. Moreover, there are 5 different patent applications among them i.e. Huawei Tech Corporation, Univ Mcgill, Inha Ind Partners Hip Inst, Broad Com Corporation and Univ Sungkyun Kwan Res & Bus. Huawei Tech corporation has 4 patents [21-24] about this topic and their main focus is to lower complexity and to reduce time delay of block codes. In WO2016172934 (A1) a parallel decoding scheme is presented. However, in this study there is still dependency on previously decoded bits while decoding nth bit. A team from MC Gill university has two patents [25-26]. Their main focus is to design adaptive polar code system for any length of data and decreasing the complexity of the likelihood calculations by using some simplifications.

Inha Ind Partners Hip Institute has two patents [27-28] and their focus is also about reducing the complexity of the operation. Patent of Broad Com Corporation [29] is about frozen bit selection. Frozen bits are set different bit patterns rather than '0' which are derived for the trellis decoder with different routing structure. In [30], an extension is done to polar coding. Extension solves error floor problem with minimum distance logic.

SUMMARY

A new approach for the high speed decoding of polar codes is presented in this document. Main novelty is decoding bits without waiting the previous ones. The proposed method can be implemented in digital devices capable of parallel processing abilities, such as FPGA. Using the suggested method, it is possible to decode the polar codes with much reduced decoding latency. One aspect of the invention, the method of high speed decoding of polar codes decode all the information bits simultaneously of same time.

Another aspect of the invention, the method of high speed decoding of polar codes at the top node of the tree, the decision is made using:

$$u_i = \begin{cases} 0, & \text{if } LR_{u_i} \geq 1 \\ 1, & \text{otherwise} \end{cases}.$$

Another aspect of the invention, the method of high speed decoding of polar codes a provide bitwise parallel decoding.

Another aspect of the invention, the method of high speed decoding of polar codes reduce latency and increase speed.

Another aspect of the invention, the method of high speed decoding of polar codes use the second group containing the rest of the N/2 channels for the data bits.

Another aspect of the invention, the method of high speed decoding of polar codes data bits decoded in a parallel without needing the previously decoded bits.

Another aspect of the invention, the method of high speed decoding of polar codes F-type nodes characterized by not having bit-labels.

Another aspect of the invention, the method of high speed decoding of polar codes g-type nodes characterized by having bit-labels.

BRIEF DESCRIPTION OF THE DRAWINGS

The figures used to better explain developed with this invention and their descriptions are as follows:

FIG. 3 Improved high-speed decoding approach

DETAILED DESCRIPTION OF THE EMBODIMENTS

Polar codes are a recently discovered family of capacity-achieving codes that are seen as a major breakthrough in coding theory. Polar codes are the first mathematically proven capacity achieving codes. The proposed high-speed decoding algorithm can decode all the information bits simultaneously at the same time, i.e., in parallel. Next, improved version of the proposed high speed decoding algorithm is introduced. The proposed high speed decoding approach and its improved version are simulated on computer environment and their BER performances are compared to that of the classical successive cancellation method.

The present invention has been described in detail in the following.

In this section, a novel high speed decoding technique for successive cancellation polar decoding is going to be demonstrated. A proposed High-speed decoder is based on original SC decoder which is limited by the bit by bit decoding strategy [1], [6]. Since the original SC decoder requires (2N−2) cycles to output a codeword, the latency with large N is not suitable for real-time high-speed applications [6]. Therefore, the design of low-latency and high-speed polar decoders is a requirement for the employment of polar decoders in practical applications. Our proposed algorithm can decode N successive bits at the same time. Therefore, the latency can be reduced and speed can be increased.

The presented N-bit-decoding algorithm, able to decode N bits at the same time (in parallel), i.e., it can decode $n^{th}$ bit without a need to (n−1) previously decoded bits. The estimated code word is denoted by $\hat{u}_1^N=(\hat{u}_1, \ldots \hat{u}_N)$. If $u_i$ is a frozen bit, then it's simply assigned $\hat{u}_i=0$. Otherwise, the code bit can be determined by (2). In the next section, the proposed algorithm is explained in detail.

4. High-Speed Decoding Algorithm

Figure 1:
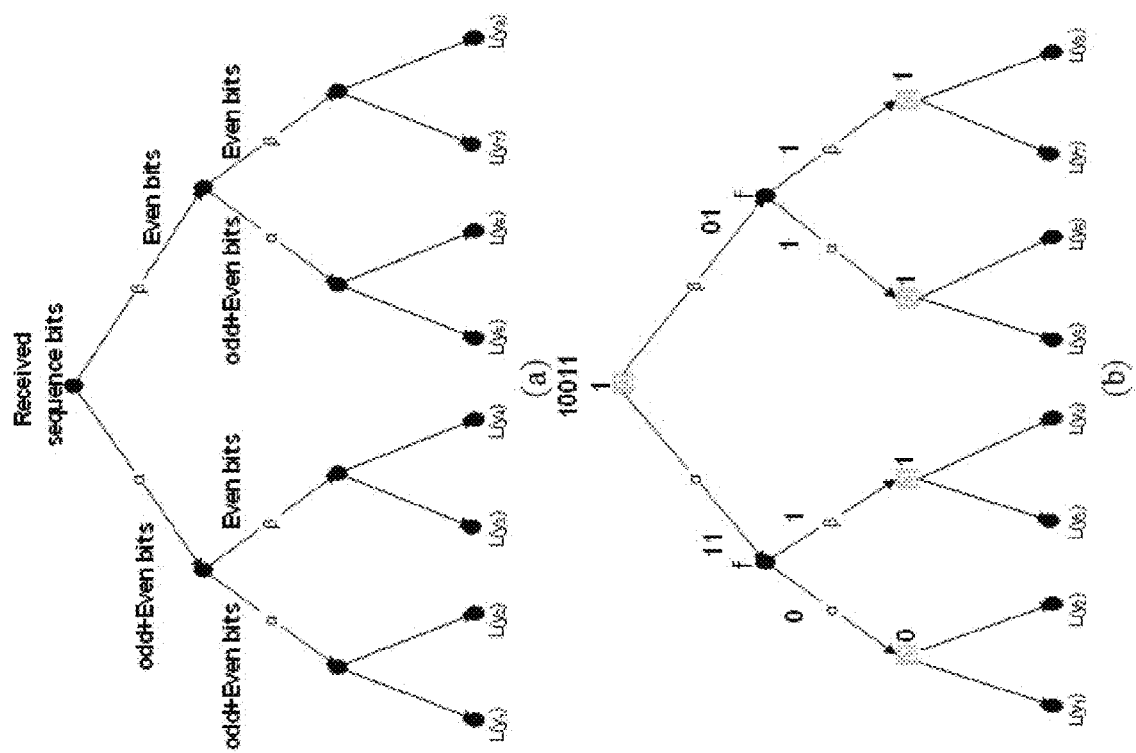
FIG. 1 (a) The idea of bit distribution stage for SC decoder (b) A numerical example of bits distribution for SC decoder at block-length 8.
Figure 2:
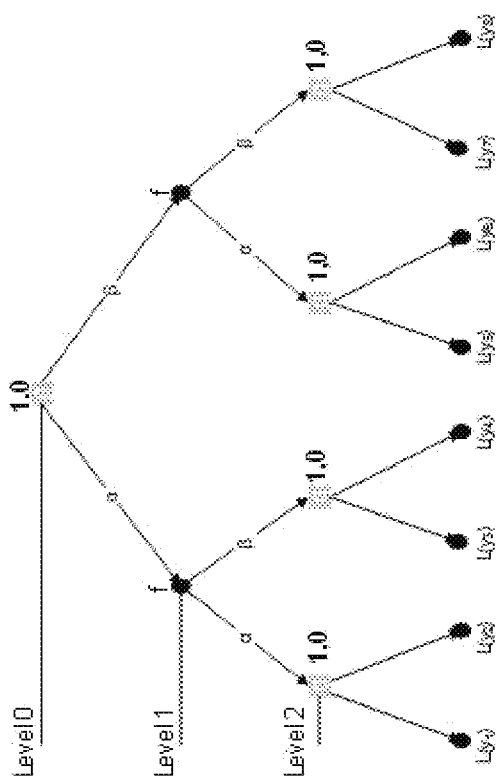
FIG. 2 A numerical example of bits distribution for presented high-speed decoder at block-length 8.
Figure 4:
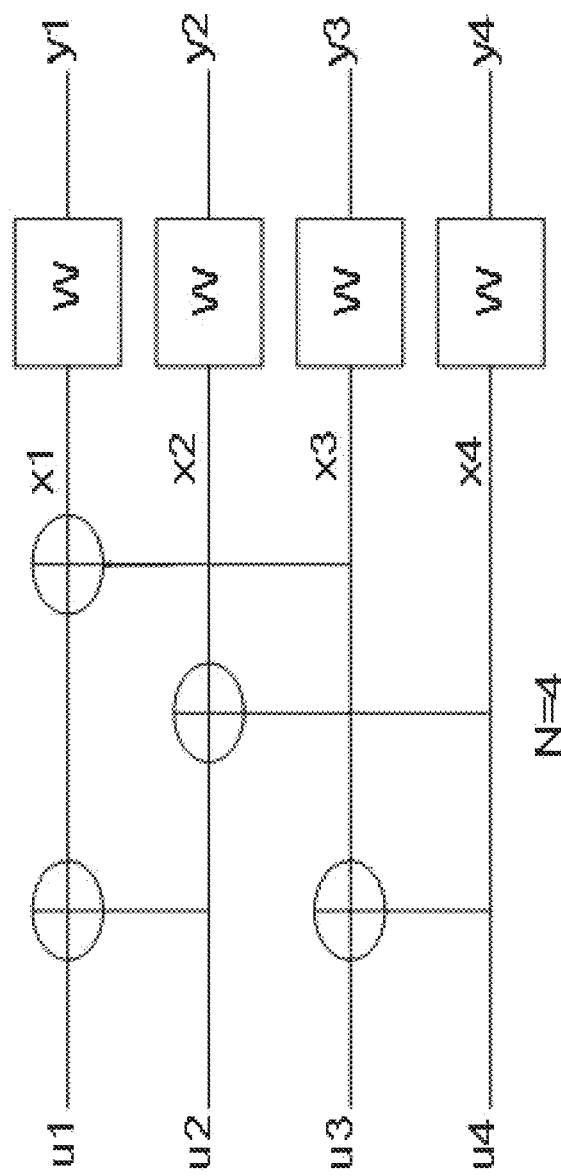
FIG. 4 $W_4$, $W_2$ and W channels
Figure 5:
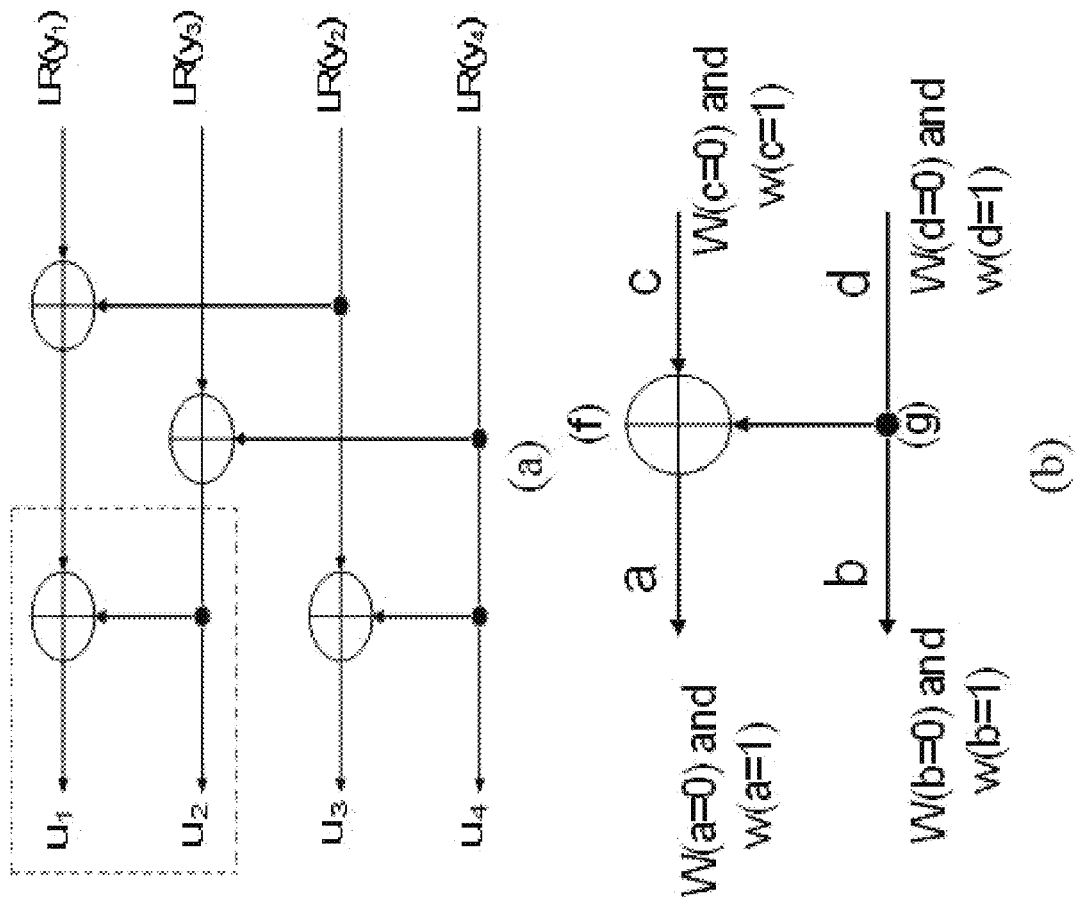
FIG. 5 (a) Right to left decoding procedure with N=4. (b) Basic decoding computation unit.
Figure 6:
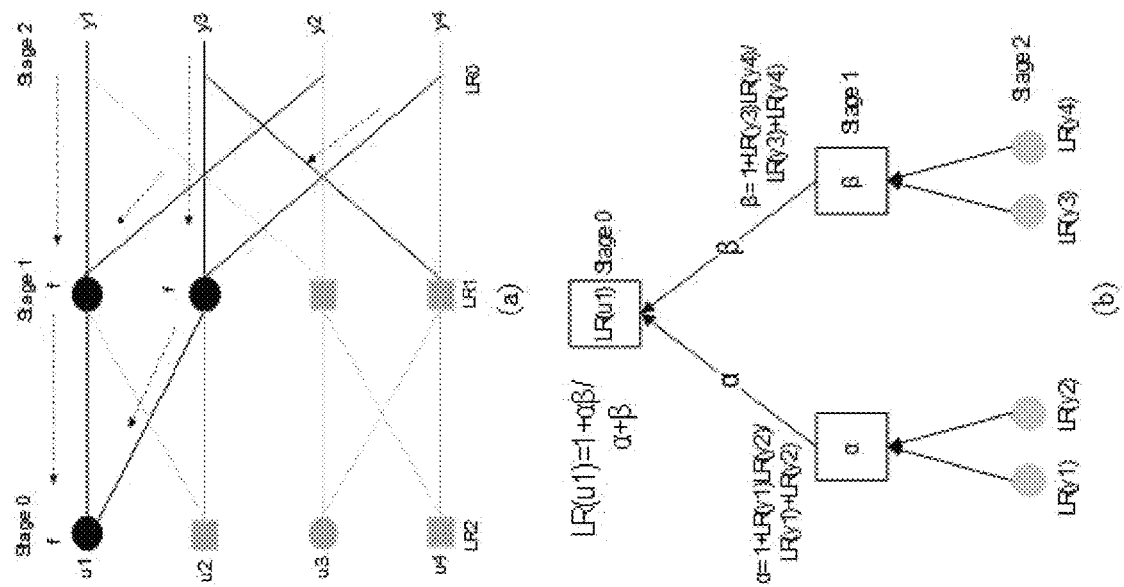
FIG. 6 (a) The calculation of the node likelihoods for the decoding of $u_1$ (b) The tree structure.

Using the proposed code tree in FIG. 6b the decoding operation can be divided into two parts, distribution of the previously decided bits to the nodes, and calculation of node LRs for the decoding of current bit. In the bit distribution stage, the code tree is divided into $\log_2 N$ levels, where N is frame length a power of 2. When the previously decoded information bits are distributed to the nodes, it's seen that nodes at certain levels receive the distributed bits, i.e., g-nodes appears at certain levels. Let us call the levels where g-nodes appear as active levels. In fact, for the distribution of 1 previously decoded bits, the active levels can be determined using $$l = \sum_i 2^i \qquad (1)$$

where i denotes the active level index. The g-nodes in active levels have labels 1 or 0. The distribution of the previously decoded bits to the nodes is illustrated in FIG. 1a where it is clear that the decoded bit frame is divided into its even and odd elements and divided parts are added for the left node and even part is used for the right part, and this procedure is continued until a single bit is available for each node. For the better understanding of bits distribution stage, in FIG. 1*b* numerical example of decoding of 6th bit with frame length N=8 is illustrated. In FIG. 1*b*, it is assumed that the previously decoded 5 bits are "1 0 0 1 1". To start the decoding of 6th bit, the previously decoded 5 bits are distributed into the nodes. The number of previously decoded bits is 5, and 5 can be written as $$5 = \sum_i 2^i \rightarrow 5 = 2^0 + 2^2$$

where powers of 2 indicates the locations of g-type nodes. i.e., they indicate the active levels. From FIG. 1*b*, it is clear that levels 0 and 2 are active levels, and the nodes in these levels are all g-type nodes, i.e., nodes have bit-labels; the bit-labels either include zero or one. This idea can be generalized as in FIG. 2. The nodes in active levels node-bits, and the node-bits can be either '0' or '1'.

After the first stage of the decoding operation, i.e., distribution of previously decoded bits to the nodes, the second stage of the decoding operation starts. In the second stage of the decoding operation LRs of the nodes in each level starting from bottom level to top level are calculated. In addition, during the LRs calculations (10) is used for f-type nodes and (11) is used for g-type nodes. F-type nodes do not have bit-labels; on the other hand g-type nodes have bit-labels. After calculating the likelihood of the top-node, the decision for the decoding of current bit is made according to $$\hat{u}_i \triangleq \begin{cases} 0, & \text{if } LR \geq 1 \\ 1, & \text{otherwise} \end{cases} \quad (2)$$

Since frozen bits are chosen as '0', likelihood calculation is not needed for frozen bits and they are automatically resolved as '0' and used for the decoding of next bit in decoding sequence.

5. High-Speed Decoding

For an N-bit information sequence, after channel splitting operation there are N new channels. For these N channels it is seen that most of the low capacity channels occurs in the first half, i.e., low capacity channels have indices 1, ..., N/2. And most of the frozen bits are assigned to these low capacity channels. This is the main motivation of our study. Although some of the channels in the second half have low capacities, their number is few considering the total number of channels. For this reason, the first group containing N/2 channels dedicated to the frozen bits, and use the second group containing the rest of the N/2 channels for the data bits. This means that the decoding operation starts for the data bits transmitted through the second part of the communication channels.

When N/2 frozen bits are distributed on the tree, it is seen that N/2 nodes get '0' as node-bit. Besides, these N/2 nodes exist on the same level which is called as frozen level. When the bit distribution is performed for the decoding of consecutive data bits, it is seen that these N/2 nodes always contain '0's as node-bits, i.e., frozen level stay the same. And some levels depending on the order of the data bit to be decoded become active levels, and the nodes in these active levels either contain '0' or '1', and these nodes are nothing but g-type nodes. The likelihood ratio at these nodes can be calculated separately for node-bit '0' and node-bit '1' and the larger can be selected to be used for the nodes at upper levels. And this logic can be carried till the top level. In this way, there is no need to know the previously decoded bits, but just need to know the active and frozen levels.

The advantage of the mentioned method is that the active levels can be determined for the decoding of data bits and data bits can be decoded in a parallel manner without needing the previously decoded bits. Hence, if sufficient place can be found in an electronic device like FPGA it is possible to decode all the data bits in a concurrent manner. The algorithm explained can be outlined as in the chart Algorithm-1.

| ALGORITHM1: HIGH-SPEED DECODING |
| --- |
| 1: INPUT N FRAME LENGTH AND RECEIVED BITS. |
| 2: DETERMINE ACTIVE FROZEN LEVEL. |
| 3: LET $l = \frac{N}{2}$. |
| 4: DETERMINE ACTIVE LEVELS FOR l. |
| 5: USE G-NODES FOR ACTIVE LEVELS. |
| 6: USE F-NODES FOR INACTIVE LEVELS. |
| 7: CALCULATE LR FROM THE BOTTOM OF THE TREE TO THE TOP. |
| 8: DETERMINE THE BIT $u_{l+1}$. |
| 9: INCREMENT l, I.E., l = l + 1. |
| 10: GO TO STEP 4. |
| 11: WHEN l = N STOP. |

6. Improved High-Speed Decoding

In order to improve performance of proposed high-speed decoder, a new decoding scheme called improved high-speed decoding technique is introduced. In this new approach some percent of the information bits are decoded using the classical successive cancellation method and the rest is of the bits are decoded at the same time using the proposed parallel decoding approach. With this approach aim is to increase the BER performance of the communication system. An example of the new approach is depicted in FIG. 3 where the first N/2 bits are frozen which corresponding to low capacity channels, and successive cancellation decoding approach is employed to decode the 50% of the rest of the information bits, finally, the remaining information bits are decoded in parallel at the same time using the proposed approach. With this new proposed method, the latency of the previously proposed parallel decoding technique is increased, however, better performance is obtained considering all parallel decoding approach. In addition, the total latency is still much less than the latency of successive cancellation method. When FIG. 3 is inspected in details, it is seen that since the low capacity channels occurs in the first half of the data frame, by freezing the first half of the transmission frame the error propagation is prevented which affects the decoding of the second half, and by successively decoding some of the bits in the second half, more robust bit decisions are provided which will be used for the decoding of the rest of the bits, and for this reason better results are obtained.

Figure 8:
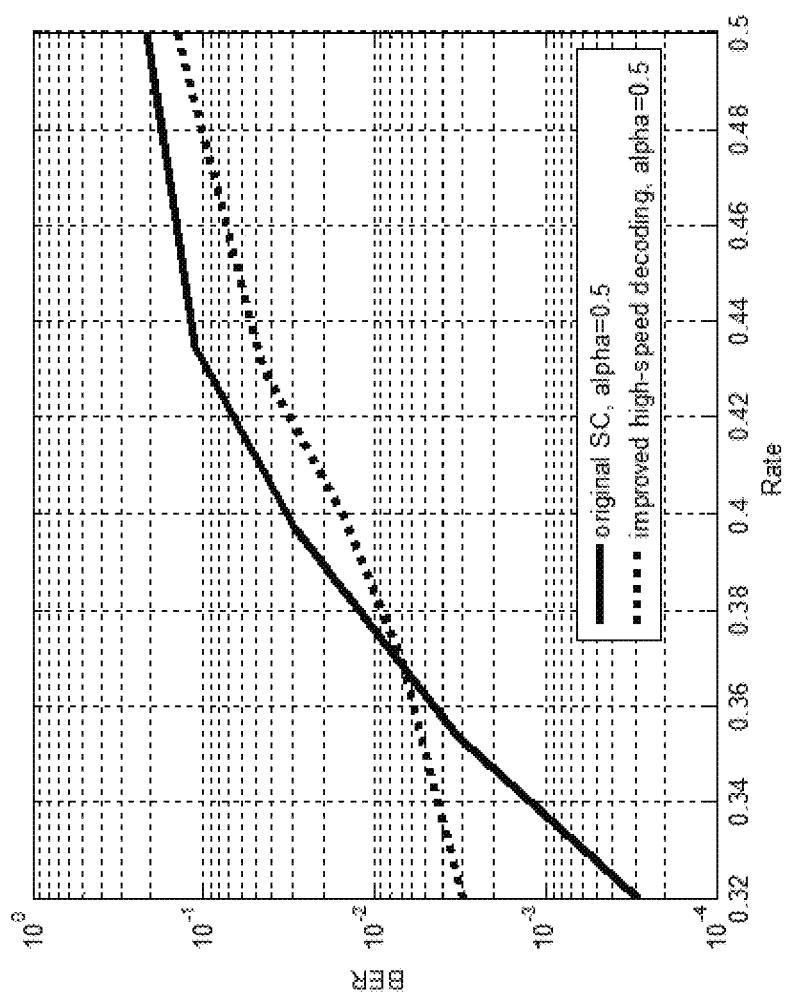
FIG. 8 Performance of comparison of SC decoding and improved high speed decoding technique at block-length $2^{10}$ on a BEC with $\alpha=0.5$.
Figure 9:
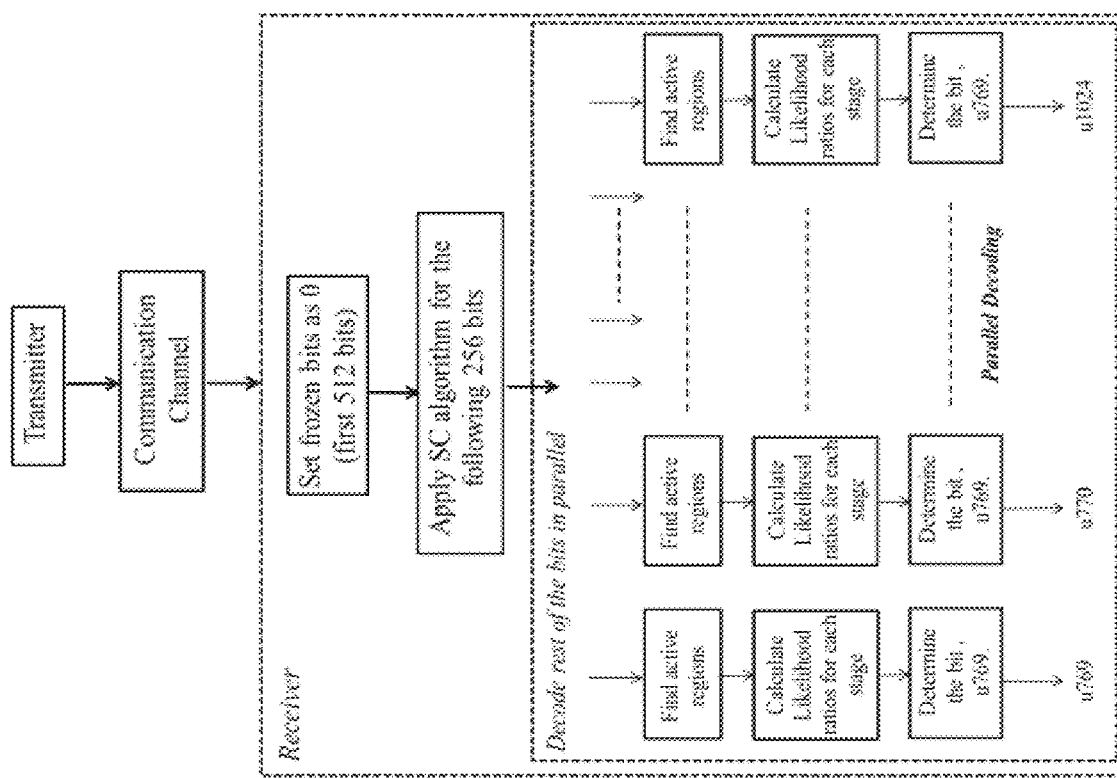
FIG. 9 Flow diagram of the presented method for $N=2^{10}$.

Computer simulation is performed using the improved high decoding method employing the frame structure in FIG. 3. And performance results are depicted in FIG. 8. It is seen from FIG. 8 that at block-length 1024 bits, the improved high-speed decoding method gives better performance with reduced latency.

Figure 7:
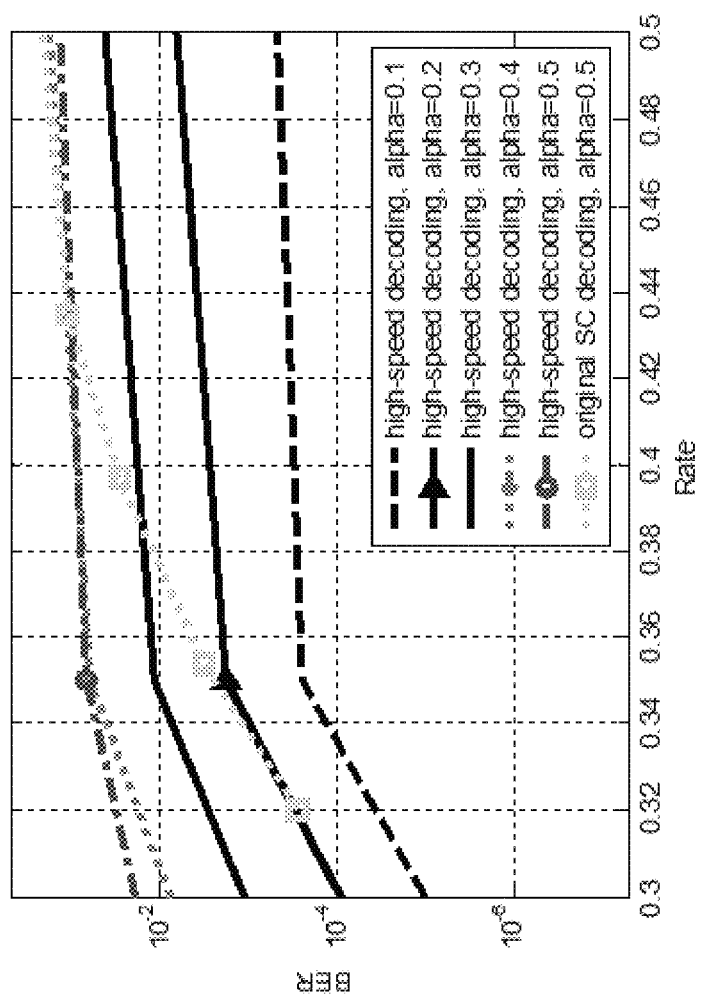
FIG. 7 Performance of comparison of SC decoding and improved high speed decoding technique at block-length $2^{10}$ on a BEC with $\alpha=0.5$.

In FIG. 7 the performance of polar codes are compared under proposed high-speed decoding approach and SC decoding at block length $2^{10}$ in terms of bit error rate BER when the communication takes place over the binary erasure channel BEC with erasure probabilities 0.1, 0.2, 0.3, 0.4 and 0.5. From simulation result, proposed high-speed decoding algorithm gives good performance at low rates, especially for the rates between 0.35 and 0.5. Computer simulation is performed using the improved high decoding method employing the frame structure in FIG. 3. And performance results are depicted in FIG. 8. It is seen from FIG. 8 that at block-length 1024 bits, the improved high-speed decoding method gives better performance with reduced latency over the binary erasure channel BEC with erasure probability 0.5.

A high speed low latency decoding algorithm for polar codes, such that, using the proposed algorithm it is possible to decode all the information bits simultaneously in parallel, is shown. BER performance of polar codes under proposed high-speed decoding method over binary-erasure channels is obtained via computer simulations. From simulation results, it's obvious that proposed high-speed decoding algorithm shows good performance at high code rates, especially for the rates between 0.35 and 0.5. The proposed high-speed decoding algorithm gives a great improvement in polar codes decoding speed. For frame length N=1024 and rate=0.5, while original SC decoder can decode only one bit for a decoding stage, the proposed high-speed decoder can decode 512 bits all together at the same decoding stage and since in the proposed high-speed decoding algorithm there is no need to know the previously decoded bits. Next, it's suggested that an improved version of the proposed high speed decoding technique. The proposed improved high speed decoding method shows better performance than that of the classical successive cancellation decoding method at high rates with much lower decoding latency. In fact, originally for N=1024, at least 1024 clock cycles to decode whole sequence. However, only 257 (256 for SC decoding, 1 for proposed method) clock cycles are sufficient.

From the above detailed description, the method of high speed decoding of polar codes comprising the steps of;
the data bits transmitted through the second part of the communication channels,
In receiver part;
For setting frozen bits as 0(first 512 bits);
Input N frame length and received bits,
Determine active frozen level,
Let $$l = \frac{N}{2},$$

Apply Sc algorithm for the following 256 bits,
For decoding rest of bits in parallel;
For finding active region;
Determine active levels for l,
Use g-nodes for active levels,
Use f-nodes for inactive levels
For calculating likelihood ratios for each stage;
Calculate LR from the bottom of the tree to the top
Determine the bit $u_{l+1}$,
Increment l, i.e., l=l+1,
Go to determine active levels for l,
When l=N stop.

What is claimed is:

1. A method of high speed decoding of polar codes comprising the steps of;
transmitting data bits through a second part of communication channels,
wherein a receiver is provided to;
set frozen bits as 0 (first 512 bits);
input N frame length and received bits,
determine active frozen level, and
let $$l = \frac{N}{2},$$

applying Sc algorithm for following 256 bits,
decoding remaining bits in parallel;
finding an active region comprising;
determining active levels for l,
using g-nodes for active levels, and
using f-nodes for inactive levels,
calculating likelihood ratios for each stage comprising;
calculating LR from a bottom of a tree to a top thereof, and
determining a bit $u_{l+1}$,
increment l, i.e., l=l+1, and
determining active levels for l,
when l=N stop.

2. The method of high speed decoding of polar codes according to claim 1; wherein all information bits are simultaneously decoded.

3. The method of high speed decoding of polar codes according to claim 1; wherein at the top node of the tree, a decision is made using:

$$u_i = \begin{cases} 0, & \text{if } LR_{u_i} \geq 1 \\ 1, & \text{otherwise} \end{cases}.$$

4. The method of high speed decoding of polar codes according to claim 1; wherein the method comprises bitwise parallel decoding.

5. The method of high speed decoding of polar codes according to claim 1; wherein the method reduces latency and increases speed of decoding.

6. The method of high speed decoding of polar codes according to claim 1; wherein the method includes use of a second group containing remaining N/2 channels for data bits.

7. The method of high speed decoding of polar codes according to claim 1; wherein data bits are decoded in parallel without needing previously decoded bits.

8. The method of high speed decoding of polar codes according to claim 1; wherein the method includes F-type nodes characterized by not having bit-labels.

9. The method of high speed decoding of polar codes according to claim 1; wherein the method includes g-type nodes characterized by having bit-labels.

* * * * *